(12) United States Patent
Zschieschang et al.

(10) Patent No.: US 7,396,566 B2
(45) Date of Patent: Jul. 8, 2008

(54) FABRICATION OF ORGANIC ELECTRONIC CIRCUITS BY CONTACT PRINTING TECHNIQUES

(75) Inventors: Ute Zschieschang, Erlangen (DE); Marcus Halik, Erlangen (DE); Hagen Klauk, Erlangen (DE); Guenter Schmid, Hemhofen (DE)

(73) Assignee: Infineon Technologies, AG, Neubiberg (DE)

( * ) Notice: Subject to any disclaimer, the term of this patent is extended or adjusted under 35 U.S.C. 154(b) by 127 days.

(21) Appl. No.: 11/066,550

(22) Filed: Feb. 28, 2005

(65) Prior Publication Data

US 2005/0163932 A1    Jul. 28, 2005

Related U.S. Application Data

(63) Continuation of application No. PCT/DE03/02837, filed on Aug. 25, 2003.

(30) Foreign Application Priority Data

Aug. 30, 2002  (DE)  ................. 102 40 105

(51) Int. Cl.
  *B05D 5/12* (2006.01)
  *B05D 5/00* (2006.01)
  *B05D 3/02* (2006.01)

(52) U.S. Cl. .................. 427/256; 427/58; 427/359; 427/383.1

(58) Field of Classification Search .................. 427/58, 427/256, 383.1, 359
See application file for complete search history.

(56) References Cited

U.S. PATENT DOCUMENTS

| | | | |
|---|---|---|---|
| 5,201,268 A | | 4/1993 | Yamamoto et al. |
| 5,362,513 A | | 11/1994 | Shimada et al. |
| 5,366,760 A | | 11/1994 | Fujii et al. |
| 5,408,926 A | * | 4/1995 | Alder .................. 101/170 |
| 6,347,584 B1 | * | 2/2002 | Kawamoto et al. .......... 101/170 |
| 6,378,424 B1 | * | 4/2002 | Hayama et al. ............ 101/170 |
| 6,506,438 B2 | * | 1/2003 | Duthaler et al. ............. 427/58 |
| 6,686,229 B2 | * | 2/2004 | Deane et al. ............... 438/151 |

(Continued)

FOREIGN PATENT DOCUMENTS

EP    0 402 942 A2    12/1990

(Continued)

OTHER PUBLICATIONS

Rogers, J.A. et al.; "Printing Process Suitable for Reel-to-Reel Production of High-Performance Organic Transistors and Circuits"; Advanced Materials, 1999, vol. 11, No. 9; pp. 741-745.

(Continued)

*Primary Examiner*—Brian K. Talbot
(74) *Attorney, Agent, or Firm*—Edell, Shapiro & Finnan, LLC

(57) ABSTRACT

A method for fabricating an organic conductor path on a substrate includes providing a printing stamp with a hydrophobic patterned printing side that is loaded with a printing medium containing an organic conductive polymer and, by bringing it into contact with a hydrophilic substrate, a patterned layer including the organic polymer are formed on the substrate. The method can be operated continuously through selection of suitable geometries for the printing stamp and the substrate.

11 Claims, 3 Drawing Sheets

U.S. PATENT DOCUMENTS

| | | | |
|---|---|---|---|
| 6,745,693 B2 * | 6/2004 | Teng | 101/463.1 |
| 6,821,329 B2 * | 11/2004 | Choy | 106/31.58 |
| 2004/0063267 A1 | 4/2004 | Bernds et al. | |
| 2004/0209191 A1 | 10/2004 | Bernds et al. | |

FOREIGN PATENT DOCUMENTS

| | | | |
|---|---|---|---|
| EP | 0402942 | * | 12/1990 |
| WO | WO 01/17319 A1 | | 3/2001 |

OTHER PUBLICATIONS

Loo, Y. et al.; "Contact Printing with Nanometer Resolution"; Device Research Conference, 2002, 60$^{th}$ DRC, Conference Digest, pp. 149-150.

Schift, H. et al.; "Nanostructuring of Polymers and Fabrication of Interdigitated Electrodes by Hot Embossing Lithography"; Microelectronic Engineering, vol. 46, 1999; pp. 121-124.

* cited by examiner

FABRICATION OF ORGANIC ELECTRONIC CIRCUITS BY CONTACT PRINTING TECHNIQUES

CROSS REFERENCE TO RELATED APPLICATIONS

This application is a continuation of PCT/DE2003/02837, filed Aug. 25, 2003, and titled "Fabrication of Organic Electronic Circuits by Contact Printing Techniques," which claims priority under 35 U.S.C. §119 to German Application No. DE 102 40 105.5, filed on Aug. 30, 2002, and titled "Fabrication of Organic Electronic Circuits by Contact Printing Techniques," the entire contents of which are hereby incorporated by reference.

FIELD OF THE INVENTION

The invention relates to a method for fabricating an organic conductor path on a substrate.

BACKGROUND

In conventional semiconductor technology based on inorganic semiconductors, a period of several months is generally required in order to fabricate first patterns of the corresponding chips from a circuit design. These comparatively long periods of time are caused, in part, by the multiplicity of very complicated production steps comprising a wide variety of methods such as photolithography, deposition etching processes and the like that are involved when progressing through the fabrication of the microchip.

For specific applications, conductive organic polymers are appropriate in the long term as an alternative to the inorganic semiconductor materials that have been used heretofore. Organic layer systems can be applied to a substrate in a relatively uncomplicated manner by means of suitable printing techniques. In contrast to microelectronic components based on inorganic semiconductors, structures made of organic conductive materials can be fabricated comparatively cost-effectively.

However, the task of patterning the conductive material in accordance with the circuit logic to be obtained is still required for organic layer systems. If polymer layers are deposited onto a substrate, there are in principle the possibilities of either patterning the polymer layer after deposition, defining individual regions on the substrate in a targeted manner prior to deposition, or controlling the deposition of the polymer onto the substrate in a defined manner. The last-mentioned possibility affords the advantage of saving material costs and complicated cleaning or recovery processes.

If the polymer layer is intended to be patterned only after deposition, then it is possible, by way of example, to incorporate suitable photoactive components into the polymer and to generate a polymer having photoactive properties in this way. Through selective exposure, it is then possible, by way of example, to alter the solubility of the polymer in a developer in a targeted manner.

As an alternative, it is also possible to apply a photoresist layer to the polymer layer, which photoresist layer is initially selectively exposed with the aid of a photomask in order to prepare for a patterning. After the development of the photoresist layer, a mask is obtained, and the uncovered sections of the polymer are removed in a subsequent etching step, in most cases a plasma process. Finally, the photomask also has to be removed, e.g. by means of a suitable solvent.

A considerable disadvantage of this method is the need for a costly photolithographic process step. Besides high material and apparatus costs for the provision of the photomasks, photomask exposers, photoresists, developer solutions and solvents, in some instances special wastes that can only be disposed of with a high outlay also arise during production. Moreover, the technique of photolithography only permits a limited number of substrate elements to be patterned in a single production cycle, corresponding outage times for preparation and follow-up measures likewise having to be taken into consideration, which lead to a low process throughput.

In addition to optical methods for selective exposure using photomasks, it is also possible to use mechanical methods for patterning. Thus, by way of example, the screen printing method affords the possibility of applying a patterned resist layer to the polymer. Analogously to the optical methods, this method likewise requires a structure transfer process for transferring the resist layer onto the substrate in an etching process and the subsequent removal of the resist. In comparison with the optical methods, however, the structure resolution that can be achieved is only approximately 200 μm and can therefore only be used for producing relatively coarse structures. It is thus sufficient for imaging large-area interconnects and electrodes but has to be replaced by higher-resolution methods in the case of finer structures, such as large scale integrated circuits.

Inkjet printing is also a mechanical method for producing defined structures in polymer layers. In this case, the polymer is sprayed onto the substrate surface as a solution in the form of small droplets. This requires the polymer either itself to be present in a printable constitution or to be correspondingly prepared by admixture of suitable solvents and additives. The additives and solvents should rapidly evaporate after application in order to prevent the layer structure from running together.

A method is disclosed in Sirringhaus, H, Kawese, T. Friend, R.H.: *High-Resolution Ink-Jet Printing of All-Polymer Transistor Circuits, in MRS Bulletin* (July 2001), in which a template is used to define the regions to be printed on the substrate surface. The template comprises fine polyimide structures which are not wetted by the polymer printing ink and thus serve as a structure base in the subsequent inkjet printing.

However, the inkjet method has a series of disadvantages. The polyimide structures initially have to be patterned by photolithographic methods, resulting in high costs being incurred. In addition, dispensing with the use of polyimide structures leads to a reduction of the resolution as a result of the printing structure running together. As a further disadvantage, the inkjet method permits only a line-by-line structure construction, thereby causing a low throughput rate and hence high process costs.

Consequently, while the high resolutions of photolithographic patterning techniques are associated with high costs, the less expensive screen printing or inkjet methods permit only a low resolution.

SUMMARY OF THE INVENTION

In light of the above, it is an object of the invention to provide a cost-effective method for patterning polymer films made of electrically conductive organic polymers which further enables a high resolution even of small structures.

This and other objects are achieved in accordance with the present invention by implementing a method for fabricating an organic conductor path on a substrate, comprising least the following steps: providing a substrate; providing a printing stamp with a patterned printing side situated thereon, the patterned printing side having elevated sections and deeper sections arranged between the elevated sections and which correspond to a structure to be imaged; loading of the patterned printing side with a printing medium containing at least one conductive organic polymer or a precursor of such a polymer; if appropriate, removing excess printing medium from the elevated sections of the patterned printing side, so that the printing medium remains only in the deeper sections of the patterned printing side; mutual arranging and aligning of the substrate and the printing stamp with respect to one another, the substrate being arranged on the patterned printing side, and bringing the patterned printing side into contact with the substrate; and removing the printing stamp from the substrate and transferring the printing medium situated in the patterned printing side onto the substrate.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION

Figure 1A:
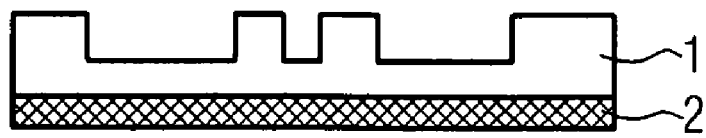
FIGS. 1A-1F depict a schematic illustration of a sequence of a printing operation in accordance with the present invention.

The present invention provides a very simple and cost-effective method for producing structures made of a conductive polymer on a substrate. In contrast to time- and cost-intensive photolithographic methods, hardly any residues of materials and chemicals used are obtained during the method. A complex preparation of substrate, photoresist, exposure mask and exposure apparatus is not necessary and the method can also be carried out continuously given corresponding geometry of substrate and printing stamp, with the result that it is possible to achieve high turnover at low cost.

The achievable resolution is also extremely satisfactory for a method based on mechanical processes for applications in microelectronics and distinctly surpasses the resolution that can be achieved with comparable mechanical methods such as inkjet printing or screen printing.

In accordance with the present invention, a method for fabricating an organic conductor path on a substrate includes the steps of: providing a substrate; providing a printing stamp with a patterned printing side situated thereon, the patterned printing side having elevated sections and deeper sections arranged between the elevated sections and which correspond to a structure to be imaged; loading of the patterned printing side with a printing medium (a printing medium) containing at least one conductive organic polymer or a precursor of such a polymer; if appropriate, removing excess printing medium from the elevated sections of the patterned printing side, so that the printing medium remains only in the deeper sections of the patterned printing side; mutual arranging and aligning of the substrate and the printing stamp with respect to one another, the substrate being arranged on the patterned printing side, and bringing the patterned printing side into contact with the substrate; and removing the printing stamp from the substrate and transferring the printing medium situated in the patterned printing side onto the substrate.

In an advantageous embodiment of the method according to the invention, the printing solution transferred onto the substrate is fixed by a baking step. The elevated temperature during the baking step means that solvent residues can evaporate, so that only the constituents dissolved in the printing medium remain and the desired structure composed of said constituents is solidified and fixed on the substrate. Moreover, particularly at the beginning of solvent evaporation, the removal of solvent increases the viscosity of the printing solution, thereby preventing the solution from running together after the printing process and stabilizing the imaged structure directly after application.

It is advantageous to provide the patterned printing side with a hydrophobic interface and the substrate a hydrophilic interface. The opposing interface properties of the patterned printing side and substrate facilitate stripping the printing medium from the patterned printing side and transferring the latter onto the substrate surface. This ensures that the substantially complete transfer of the printing medium from the patterned printing side onto the substrate is achieved. No residues of the printing medium that may cause defective structure imaging remain in the deeper sections of the printing stamp. At the same time, the speed at which the printing solution is transferred is optimized in the case of opposing interface properties, with the result that a higher turnover of structures formed can be achieved.

The contrast in interface properties between patterned printing side (hydrophobic) and substrate (hydrophilic) can be achieved by producing the patterned printing stamp from a hydrophobic material (e.g. hydrophobic polymers such as polybenzoxazoles, polyimides, novolaks, etc.) and the substrate from an oxidic material (e.g. glass or ceramic) or a metal (e.g. copper or nickel). In addition, polymers containing hydroxyl groups (e.g. polyvinylpyrrolidone) or else polymers that are subsequently functionalized with hydroxyl groups, for example by treatment in oxygen plasma, are also suitable for the fabrication of the substrate.

It is particularly advantageous to provide a printing solution that is hydrophilic. Similar interface properties of substrate and printing solution (in this case a hydrophilic nature) facilitate the adhesion of the printing solution to the substrate. The comparable interaction between the molecules of the printing solution and the molecules of the substrate surface in comparison with the interactions between substrate molecules and printing solution molecules among one another furthermore brings about a stabilization of the printed-on structure since the printing structure is largely prevented from running apart and thus being destroyed. Moreover, the stripping of the printing medium from the patterned printing side is facilitated by the opposing interface properties and situations in which the printing solution remains in the depressions of the patterned printing form are counteracted by the capillary forces present. Furthermore, a hydrophilic nature of the printing solution results in a large surface tension with respect to air (hydrophobic), as a result of which the structure of the printing medium applied to the substrate is stabilized by the formation of a large contact angle at the edge regions of the structure.

Printing suspensions may also be used as an alternative to printing solutions. When using a printing suspension, it is necessary to take account of a substantially homogeneous distribution and dispersion of the suspended particles (e.g. organic conductive polymers as carriers of electrical conductivity) in the dispersion medium in order to achieve a uniform distribution of the particles in the structure produced and thus a reproducible behavior of a resultant electronic circuit structure that is formed. As used herein, the term "printing medium" refers to a medium composed of one or both of a printing solution and a printing suspension.

In an advantageous embodiment of the invention, the hydrophobic interface of the patterned printing side and, respectively, the hydrophilic interface of the substrate are produced by an interface treatment. An interface treatment extends the number of materials that can be used in practicing the invention since the interface can be modified largely independently of the bulk properties. By means of corresponding treatments, it is often possible for the interface properties to be better optimized (i.e. for example set to a specific surface tension value) than would be possible just through pure material selection. In this way, it is also possible to achieve, when required, a reversal of the interface properties from hydrophilic to hydrophobic, and vice versa. Thus, for example, a hydrophilization can be achieved by means of an oxidative treatment with introduction of hydroxyl groups, amine groups or thiol groups, while a hydrophobization of a hydrophilic surface can be achieved using the reactive surface atoms by binding monofunctional compounds with hydrophobic alkyl radicals. In this case, the surface treatment, for increasing the hydrophilic/hydrophobic contrast, may be achieved by application of a dilute solution of the corresponding hydrophobizing reagent and evaporation of the solvent or application of the reagent from the gas phase. This opens up the possibility of using hydrophilic materials that are originally to be used as substrates also as materials for the printing stamp provided with a hydrophobic printing side, and vice versa.

The printing stamp preferably has a cylindrical geometry, the patterned printing side being arranged on the circumferential area thereof. It is possible to realize a continuous method in this way, the printing stamp in the form of a roller, roll or drum being brought into contact with the substrate. Continuous methods have the advantage of enabling faster production cycles since the dead times that occur in discontinuous methods and serve to prepare for a subsequent production cycle are omitted. As a result, the turnover rate is increased and better production capacity utilization is achieved, as a result of which the production costs can be reduced overall.

It is advantageous for the patterned printing side and/or the printing stamp to be composed of a flexible material. Flexible materials permit better contact-making between printing stamp and substrate since irregularities of the surfaces involved (e.g. unevennesses or contaminating particles that have been introduced) are compensated for given a corresponding contact pressure. As a result, the structure transfer quality is improved and the error rate is reduced.

It is particularly advantageous for the substrate to be composed of a flexible material. In addition to the advantageous effect on the printing quality already mentioned, a continuous method can be realized in the case of flexible substrate materials, for example by the use of a substrate film that is continuously brought into contact with a printing stamp shaped as a roll.

In a preferred embodiment of the present invention, a pressure roller is provided, to force the flexible substrate against the patterned printing side so as to facilitate transfer of the printing solution to the substrate. In particular, a continuous method can be utilized as described below, in which the flexible substrate can be pressed onto the patterned printing side with a sufficiently high contact pressure, thereby improving the transfer quality.

The method can be applied to the same substrate a number of times with identical or different printing sides with respectively identical or different printing solutions. Particularly in the case of highly complex electronic circuits, a complex three-dimensionally patterned arrangement of circuits is present which is formed formally from stacking two-dimensional circuit planes one above the other. In this case, it is also necessary to vary the conductivity of the materials used in order to be able to realize a wide variety of electronic components. Such contact systems can be fabricated by repeated application of the method according to the invention with different printing solutions and structures.

The conductor path is preferably supplemented to form a microelectronic component. It may only be necessary to fabricate partial regions of a microelectronic component with the aid of the method according to the invention, while the remaining portion can be produced by conventional methods. This results in high flexibility in the selection of passable components to be realized whilst adhering to economic aspects, since the individual methods may require different costs.

The microelectronic component is preferably a field-effect transistor. Field-effect transistors are components that are often used in microelectronics on account of their diverse possibilities for use, comprise various structure planes and can be fabricated cost-effectively by the method according to the invention in a multistage method.

FIGS. 1A-1F illustrate the individual steps of an exemplary embodiment of a printing method in accordance with the present invention. Referring to FIG. 1A, a printing stamp is first provided including a carrier substrate 2 and a patterned printing side 1 arranged on the carrier substrate 2, where the printing side 1 includes a structure profile in the form of a positive structure.

Figure 1B:
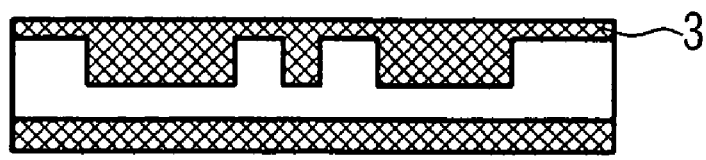

In the next step depicted in FIG. 1B, the patterned printing side 1 is loaded with a polymer solution 3 or a polymer suspension containing a conductive polymer, where the recessed sections of the patterned printing side 1 are sufficiently covered with the printing solution or suspension 3. In this step, it is not essential that the elevated sections of the patterned printing side 1 come into contact with the printing medium 3. However, as can be seen in FIG. 1B, excess printing medium 3 is situated on the elevated sections of the printing side 1.

Figure 1C:
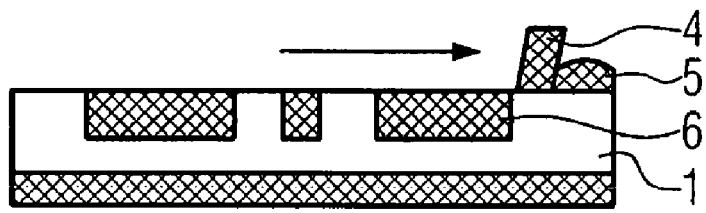
Figure 1D:
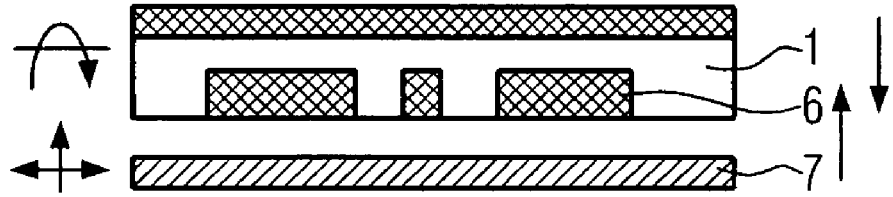
Figure 1E:
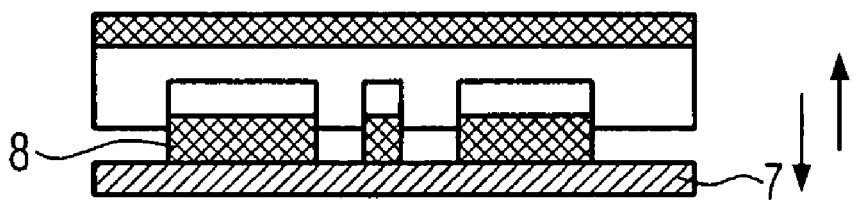

As shown in FIG. 1C, the excess printing medium 5 situated on the elevated sections of the patterned printing side 1 is removed by being stripped away mechanically with the aid of a squeegee device 4, so that only a defined volume of printing medium 6 remains in the deeper or recessed sections of the patterned printing side 1. After removal of the excess printing medium, the printing stamp is rotated 180°, as shown in FIG. 1D, with the printing medium 6 remaining in the structure of the patterned printing side 1 due to adhesion and capillary interaction, and is aligned in a suitable manner above a substrate 7. By lowering the printing stamp and/or raising the substrate 7, the patterned printing side 1 is brought into contact with the substrate 7. The patterned printing side 1 of the printing stamp is then released from the substrate 7 by raising the printing stamp and/or lowering the substrate, while the printing medium 8 is maintained on (i.e., is released from the recesses of the printing side 1) and thus defines a layered structure for the substrate 7 as shown in FIG. 1E. A small amount of organic conductive polymer may remain in the deep recess sections of the patterned printing side 1 on account of the surface tension.

Figure 1F:

The substrate 7 is then subjected to a baking process, where solvent is evaporated from the substrate and the layered structure is fixed and becomes a solidified layer structure 9 on the substrate 7 as shown in FIG. 1F.

Figure 2A:
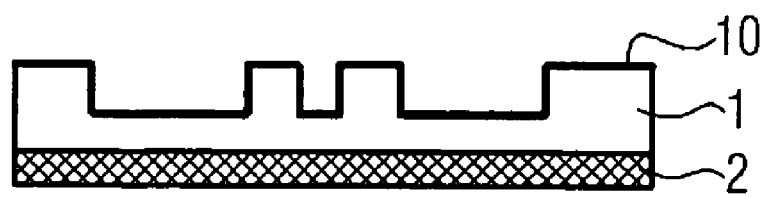
FIGS. 2A and 2B depict a schematic illustration of reinforcing a hydrophilic/hydrophobic contrast by application of a hydrophobic silane layer in accordance with the present invention.
Figure 2B:

The method for forming a circuit as described above and depicted in FIGS. 1A-1F can be modified, as depicted in FIG. 2A, by providing a hydrophobized patterned printing side 1 on a carrier substrate 2 for increasing the hydrophilic/hydrophobic contrast at the surface and thus enhance the separation of the printing medium from the printing side in order to facilitate transfer of the printing medium to the substrate. A hydrophobic silane layer 10 is applied completely on the deeper and elevated sections of the patterned printing side 1. In addition, the patterned printing side 1 may be isolated, as shown in FIG. 2B, rather than situated on a carrier substrate 2 as shown in FIG. 2A.

Figure 3:
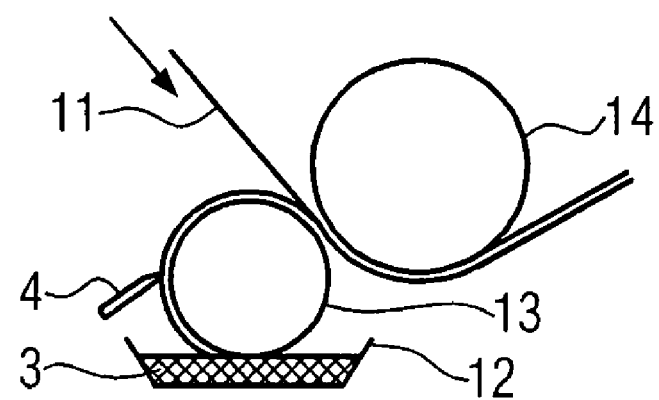
FIG. 3 depicts a schematic illustration of a printing operation in a continuous method with a roller technique in accordance with the present invention.

FIG. 3 schematically depicts how the method of the invention is carried out in a continuous manner. A rotating roll 13 acts as a printing stamp, where a patterned printing side (not shown) is arranged on the circumferential area of the roll. A specific region of the roll dips into a reservoir trough 12 containing the printing medium 3, so that the dipping region is loaded with the printing medium 3. A squeegee device 4 that just touches the elevated sections of the patterned printing side strips excess printing medium 3 away from the elevated sections of the patterned printing side, which flows back into the trough. A flexible film 11 serves as a substrate, and is pressed onto the circumferential area of the rotating roll 3 with the aid of a rotating pressure roller 14. By virtue of the opposite direction of rotation of roll 13 and pressure roller 14, the substrate film 11 is guided through between these two rollers and, upon making contact with the patterned printing side arranged on the circumferential area of the rotating roll 13, accepts the printing medium 3 situated in the deeper sections of the patterned printing side in the form of the desired structure profile. The method is carried out continuously by providing a continuous supply of substrate film 11 as well as printing medium 3 within the reservoir trough 12.

The following examples demonstrate the formation of printing stamps and circuits utilizing the methods of the present invention.

EXAMPLE 1

Fabrication of a Planar Masterplate (Photoresist)

A 1.3 μm thick layer of a positive photoresist is applied to a round 4-inch glass wafer, which serves as a printing stamp, by spin coating. The photoresist is dried for one minute at 100° C. in order to evaporate the solvent. The structures to be transferred are subsequently imaged by exposure utilizing a dark field mask. The latent image of the structures are developed to form elevated and deeper sections and the glass wafer is dried in vacuo in order to drive out the solvents. The deeper sections of the developed structures have a depth of 1.3 μm.

EXAMPLE 2

Fabrication of a Planar Printing Stamp Made of Polybenzoxazole

A layer of a poly-o-hydroxylamine (20% by weight in NMP) is applied as hydrophilic material to a round 4-inch glass wafer, which serves as a printing stamp, by spin coating. The poly-o-hydroxylamine is synthesized from isophthalic acid dichloride and 3,3'-dihydroxybenzidine 1:1 (polybenzoxazole precursor). Afterward, a baking step is carried out for 2 minutes at 120° C. in order to evaporate the solvents, followed by a heat treatment step for 2 hours at 400° C. for the purpose of cyclizing polybenzoxazole (PBO).

A layer of a positive photoresist is applied to the polybenzoxazole layer obtained by spin coating. The photoresist is dried for 1 minute at 100° C. and subsequently exposed through a dark field mask that images the structures to be transferred. The structures are developed to form the patterned printing side and dried at 100° C. to leave photoresist structures that form the etching mask for the subsequent step of etching the polybenzoxazole. Using an oxygen plasma, the polybenzoxazole is etched and the structure profile is transferred.

The residual photoresist is subsequently removed using acetone and then the glass substrate is rinsed with water and dried. The layer thicknesses of the polybenzoxazole layer and thus the depth of the reservoir are set by way of the spinning speed and formulation of the poly-o-hydroxyamine. For example, at a rotational speed of 2000 rpm (30 s), the polybenzoxazole layer thickness will be 2.5 μm; for a rotational speed 3000 of rpm (30 s), the polybenzoxazole layer thickness will be 1.8 μm; and for a rotational speed of 4000 rpm (30 s), the polybenzoxazole layer thickness will be 1.3 μm.

EXAMPLE 3

Fabrication of a Planar Printing Stamp Made of Polyimide

A layer of poly-(biphenyl-3,3'-4,4'-tetracarboxylic dianhydride-co-1,4-phenylenediamine) (10% by weight in NMP) is applied to a round 4-inch glass substrate, which serves as a printing stamp, by spin coating. The cyclization to give the polyimide (PI) is achieved by carrying out a subsequent baking step for 10 minutes at 120° C. in order to evaporate solvents and a heat treatment step for 2 hours at 400° C. A layer of a positive photoresist is applied to the polyimide layer (spin coating). The photoresist is dried for 1 minute at 100° C. and subsequently exposed through a dark field mask that images the structures to be transferred. The structures are developed and dried at 100° C. The residual photoresist structures form the etching mask for the subsequent step of etching the polyimide. The polyimide is etched by oxygen plasma, resulting in the formation of the structure profile. Finally, the residual photoresist is removed using acetone and the glass substrate is rinsed with water and dried.

The layer thicknesses of the polyimide layer and thus the depth of the reservoir can be set by varying the spinning speed. For example, for a rotational speed 2000 rpm (30 s), the polyimide layer thickness will be 1.9 μm; for a rotational speed 3000 rpm (30 s), the polyimide layer thickness will be 1.4 μm; and for a rotational speed 4000 rpm (30 s), the polyimide layer thickness will be 1.1 μm.

EXAMPLE 4

Fabrication of a Flexible Printing Stamp By Means of a Photoresist

A 1.3 µm thick layer of a positive photoresist is applied to a polyethylene naphthalate film (PEN) by spin coating. In order to evaporate the solvent, the positive photoresist is dried for 1 minute at 100° C. and subsequently exposed through a dark field mask that images the structures to be transferred. The structures are developed to form the structure profile including elevated and recessed sections, and the hydrophobic polyethylene naphthalate film is dried in vacuo. The developed structures form the reservoir for the polymer suspension with a depth of 1.3 µm. Finally, the polyethylene naphthalate film is adhesively bonded onto a round plastic cylinder that serves as a printing stamp.

EXAMPLE 5

Fabrication of a Flexible Printing Stamp Made of Polyimide

A layer of a positive photoresist is applied to a polyimide film (Kapton®) by spin coating. In order to remove solvents, the photoresist is dried for 1 minute at 100° C. and is subsequently exposed through a dark field mask that images the structures to be transferred. The structures are developed and dried at 100° C. The residual photoresist structures form the etching mask for the subsequent step of etching the polyimide. The polyimide is etched by means of oxygen plasma, thereby fashioning the structure profile. The depth of the reservoir structure can be determined by varying the etching time and also the etching rate. In the subsequent step, the residual photoresist is removed using acetone. The hydrophobic polyimide film is subsequently adhesively bonded onto a round plastic cylinder that serves as a printing stamp.

EXAMPLE 6

Hydrophobic Coating of a Printing Stamp

Octadecyltrichlorosilane (OTS) is vapor-deposited on the printing stamps described in Examples 1 to 5 and in a vacuum furnace at a temperature of 100° C. and a pressure of 200 mbar. The octadecyl group introduces hydrophobic properties into the system, while the trichlorosilane group is used for binding to the substrate, the chloride ions serving as leaving groups. In order to ensure sufficient hydrophobization, the vapor deposition time is about 1 hour. Besides hydrophobization from the gas phase, the hydrophobization may also be effected from solution by dipping into a 0.5% dry hexane solution.

EXAMPLE 7

Loading of a Planar Printing Stamp with a Polymer Suspension

The printing stamps described in Examples 1 to 3 are coated with a polymer suspension, containing PEDOT:PSS in a BaytronP® formulation commercially available from Bayer AG (Germany), by a spin coating method for 15 seconds at a rotational speed of 2000 revolutions per minute. The excess polymer suspension is stripped away with the aid of a silicone squeegee.

EXAMPLE 8

Loading of a Planar Printing Stamp with a Polymer Suspension

The printing stamps described in examples 1 to 3 are dipped into a polymer suspension containing PEDOT:PSS in a BaytronP® formulation. The excess polymer suspension is stripped away with the aid of a silicone squeegee.

EXAMPLE 9

Loading of a Flexible Printing Stamp with a Polymer Suspension

The printing stamps described in Examples 4 and 5 are dipped into a polymer suspension containing PEDOT:PSS in a BaytronP® formulation. The excess polymer suspension is stripped away with the aid of a silicone squeegee.

EXAMPLE 10

Transfer of the Polymer Suspension to an Si/SiO$_2$ Wafer

Each of the loaded printing stamps described in Examples 7 and 8 is fixed with a sample holder in such a way that the active surface with the patterned printing side is oriented downward. A substrate to be printed is a silicon wafer with a silicon dioxide layer formed by thermal oxidation. The substrate is brought into contact with the polymer suspension for 60 seconds by raising and pressing the substrate to the sample holder, which fixes the substrate to the sample holder by suction in a predetermined position.

EXAMPLE 11

Transfer of the Polymer Suspension to Glass Substrates

Each of the loaded printing stamps described in Examples 7 and 8 is fixed with a sample holder in such a way that the active surface with the patterned printing side is oriented downward. A glass plate to be printed is then brought into contact with the polymer suspension for 60 seconds by raising and pressing the substrate to the sample holder, which fixes the substrate by suction by suction in a predetermined position.

EXAMPLE 12

Transfer of the Polymer Suspension to Polymer Films

Each of the loaded printing stamps described in Examples 7 and 8 is fixed with a sample holder in such a way that the active surface with the patterned printing side is oriented downward. A polymer film to be printed is subsequently fixed on a planar carrier and brought into contact with the polymer suspension for 60 seconds by raising and pressing the polymer film to the sample holder, which fixes the substrate carrier by suction in a predetermined position.

EXAMPLE 13

Aligned Transfer of the Polymer Suspension

The transfer of the polymer suspension to the printing stamp is achieved in a similar manner as described in Examples 10 to 12, with a difference being that the substrate to be printed is first provided with a patterned layer according to a suitable method. Different orientations of a printing stamp are detected with the aid of a microscope on the basis of alignment marks provided in the layout of the respective printing stamp. In addition, the substrate holder has free mobility, so that the substrate holder is moved to a predetermined position to be in a selected alignment with the printing stamp based upon the orientation of the alignment marks.

EXAMPLE 14

Thermal Fixing of the Polymer Structures

Substrates that have been pretreated in accordance with Examples 10 to 14 are released from contact with their printing stamps and dried for 1 minute at a temperature of 100° C. and then for 2 minutes at a temperature of 120° C. on a hot plate.

EXAMPLE 15

Direct Thermal Fixing of the Polymer Structures

Substrates that have been pretreated according to Examples 10 to 14 are heated to a temperature of 80° C. while maintaining contact with their printing stamps. In this example, the heat transfer is effected via a heatable substrate holder. Afterward, the substrate is dried for 1 minute at a temperature of 100° C. and then for 2 minutes at a temperature of 120° C. on a hot plate.

EXAMPLE 16

Printing with Flexible Printing Stamps

In this example, the printing stamp described in example 9 is a plastic cylinder. The plastic cylinder is rolled over a polyethylene naphthalate film whose surface has been activated beforehand by treatment with an oxygen plasma. For this purpose, the polyethylene naphthalate film is pressed onto the roll-type printing stamp by a second roll heated to a temperature of 70° C. In this case, the travel speed of the polyethylene naphthalate film is 0.2 cm/s. Afterward, the printed film section is transferred to a furnace and dried at a temperature of 120° for the period of 5 minutes under a protective gas atmosphere.

EXAMPLE 17

Electrical Characterization in the Case of a Monolayer Printing

Figure 4:
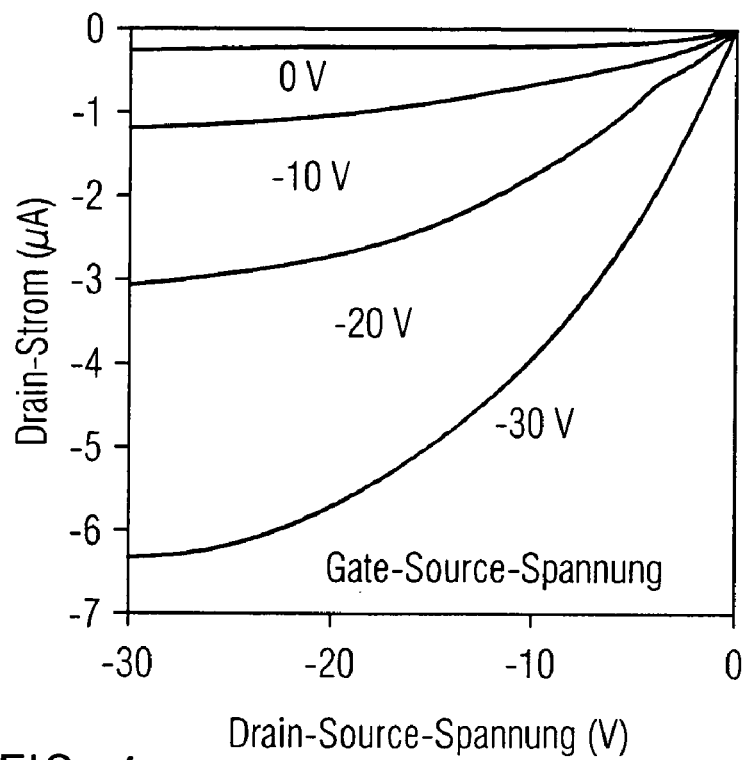
FIG. 4 is a diagram illustrating a family of characteristic curves of an organic transistor fabricated according to Example 17 (width 40 µm, length 100 µm).

A highly doped, thermally oxidized silicon wafer printed according to the method described in example 15 is provided as a substrate, where the printed-on structures correspond with a simple construction of an organic field-effect transistor (OFET), and the printed-on PEDOT:PSS structures correspond to the source and drain elements of the field-effect transistor. Pentacene is vapor-deposited as an organic conductive material onto these structures at a temperature of 60° C. Transistors having a charge carrier mobility of 0.03 $cm^2$/V-s at a threshold voltage of 16 V and a subthreshold voltage gradient of 3.4 V per decade given an on/off current ratio of $10^3$ were obtained in this example. The corresponding characteristic curve is illustrated in FIG. 4.

EXAMPLE 18

Electrical Characterization in the Case of an Aligned Multilayer Printing

A glass substrate is printed with a layer of PEDOT:PSS as described in Example 15, where the printed-on structures form a layer of an organic field-effect transistor that contains gate elements. The gate dielectric, which includes 10% poly-4-hydroxystyrene, 1% crosslinker and 89% n-butanol, is subsequently applied by means of spin coating. The coating by the spin coating method is carried out at a rotational speed of 2000 revolutions per minute for a period of 30 seconds. This is followed by drying at a temperature of 100° C. for 1 minute and, finally, the crosslinking process for the period of 2 minutes at a temperature of 200° C. on a hot plate.

Figure 5:
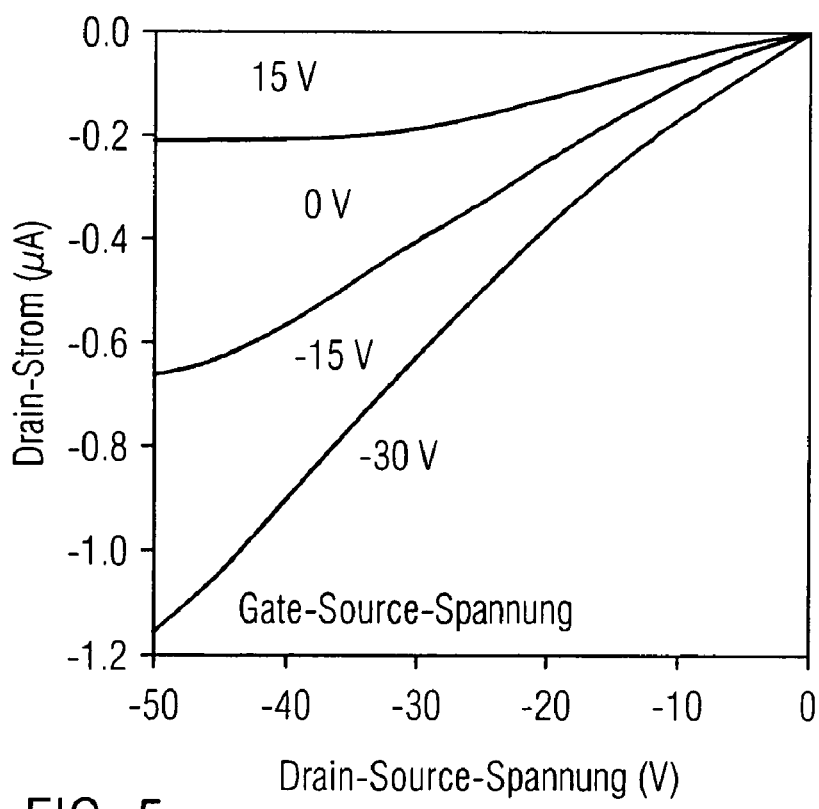
FIG. 5 is a diagram illustrating a family of characteristic curves of an organic transistor fabricated according to Example 18 (width 20 µm, length 100 µm).

The layers containing the source and drain elements are printed according to the method described in Example 13. Pentacene is vapor-deposited as an organic conductor onto the structures produced in this way, at a temperature of 60° C. Transistors having a charge carrier mobility of 0.05 $cm^2$/V-s, a threshold voltage of 20 V and a subthreshold voltage gradient of 9 V per decade given an on/off current ratio of 100 were obtained in this example. The corresponding characteristic curve of the transistor is illustrated in FIG. 5.

EXAMPLE 19

Multiple Use of the Printing Stamps

The printing stamps fabricated in Examples 2, 3 and 5 can be used repeatedly. In this example, prior to reuse, it is necessary to carry out cleaning in order to remove the residual polymer suspension. The cleaning is achieved in an ultrasonic bath containing acetone as a solvent for a period of 2 minutes. Afterward, the printing stamp is rinsed with water and dried. A renewed hydrophobization of the patterned printing side as described in Example 6 is necessary only after every fifth use or after a number of weeks when the printing stamp has not been used.

As noted above, FIG. 4 shows the family of characteristic curves of an organic transistor fabricated according to Example 17, where the current intensity at the drain contact (drain current, in μA) is plotted against the applied voltage between drain and source contacts (drain-source voltage, in V). The family parameter is the voltage applied between gate and source electrodes (gate-source voltage). The organic transistor fabricated has a width of 40 μm and length of 100 μm. From the curves plotted in FIG. 4, it is possible to discern a significant increase in the drain current as the drain-source voltage rises. This dependence increases as the gate-source voltage rises.

As noted above, FIG. 5 shows the family of characteristic curves of an organic transistor fabricated according to Example 18, where the current intensity at the drain contact (drain current, in μA) is plotted against the applied voltage between drain and source contacts (drain-source voltage, in V). The family parameter is the voltage applied between gate and source electrodes (gate-source voltage). The organic transistor fabricated has a width of 20 μm and a length of 100 μm. In this example, as in Example 17, it is possible to discern a significant increase in the drain current as the drain-source voltage rises. This dependence increases as the gate-source voltage rises.

Comparison of FIGS. 4 and 5 makes it clear that the dependence between drain current and drain-source voltage increases as the width of the transistor decreases given the same gate-source voltage, as is characteristic of a field-effect transistor. Thus, an organic field-effect transistor fabricated in accordance with the methods of the present invention includes the same features as a conventional field-effect transistor produced from an organic semiconductor.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| | List of reference symbols |
|---|---|
| 1 | Patterned printing side |
| 2 | Carrier substrate |
| 3 | Printing medium |
| 4 | Squeegee device |
| 5 | Excess printing medium |
| 6 | Defined volume of the printing medium in deeper sections of the patterned printing side |
| 7 | Substrate |
| 8 | Printing medium with a defined layer structure |
| 9 | Solidified layer structure |
| 10 | Hydrophobic silane layer |
| 11 | Flexible film |
| 12 | Reservoir trough |
| 13 | Rotating printing stamp |
| 14 | Pressure roller |

What is claimed is:

1. A method for fabricating an organic conductor path on a substrate, comprising:
   (a) providing a substrate;
   (b) providing a printing stamp with a patterned printing side situated thereon, the patterned printing side including elevated sections and recessed sections arranged between the elevated sections that correspond to a structure to be imaged;
   (c) loading of the patterned printing side with a printing medium containing at least one conductive organic polymer or a precursor thereof;
   (d) removing any excess printing medium from the elevated sections of the patterned printing side such that the printing medium remains only in the recessed sections of the patterned printing side;
   (e) mutually arranging and aligning the substrate and the patterned printing side of the printing stamp with respect to each other and bringing the patterned printing side into contact with the substrate; and
   (f) removing the printing stamp from the substrate so as to transfer the printing medium situated in the patterned printing side onto the substrate;
   wherein the patterned printing side includes a hydrophobic interface, the substrate includes a hydrophilic interface and the printing medium is hydrophilic.

2. The method of claim 1, further comprising:
   (g) upon transferring the printing medium to the substrate in step (f), baking the substrate to affix the printing medium to the substrate.

3. The method of claim 1, wherein at least one of the patterned printing side and the printing stamp comprises a flexible material.

4. The method of claim 1, wherein the substrate comprises a flexible material.

5. The method of claim 4, wherein the patterned printing side is brought into contact with the substrate by pressing the flexible material of the substrate against the patterned printing side with a pressure roller.

6. The method of claim 1, further comprising:
   (g) repeating steps (a)-(f) a plurality of times to transfer a plurality of printing mediums to the substrate.

7. The method of claim 6, wherein different printing sides are utilized in at least two series of repeating steps (a)-(f).

8. The method of claim 7, wherein the conductor path formed on the substrate by repeating steps (a)-(f) comprises a field-effect transistor.

9. The method of claim 6, wherein different printing mediums are utilized in at least two series of repeating steps (a)-(f).

10. The method of claim 1, wherein the conductor path formed on the substrate comprises a microelectronic component.

11. The method of claim 9, wherein the microelectronic component comprises a field-effect transistor.

* * * * *